United States Patent

Su et al.

[11] Patent Number: 6,026,466
[45] Date of Patent: Feb. 15, 2000

[54] MULTIPLE ROW ADDRESS STROBE DRAM ARCHITECTURE TO IMPROVE BANDWIDTH

[75] Inventors: Hua-Yu Su, Milpitas; Lik T. Cheng, San Jose, both of Calif.

[73] Assignee: Integrated Silicon Solution, Inc., Sunnyvale, Calif.

[21] Appl. No.: 08/876,997

[22] Filed: Jun. 16, 1997

[51] Int. Cl.$^7$ .................................................. G06F 12/00
[52] U.S. Cl. ......................... 711/105; 711/111; 711/147; 365/233.5; 365/230.03
[58] Field of Search ................................... 711/105, 111, 711/147, 205; 365/233.5, 203; 395/512; 345/116

[56] References Cited

U.S. PATENT DOCUMENTS

| | | | |
|---|---|---|---|
| 4,470,042 | 9/1984 | Barnich et al. | 345/116 |
| 4,704,697 | 11/1987 | Kiremidjian et al. | 395/512 |
| 5,155,834 | 10/1992 | Ryan et al. | 711/205 |
| 5,237,566 | 8/1993 | Brand et al. | 370/426 |
| 5,657,285 | 8/1997 | Rao | 365/203 |
| 5,751,656 | 5/1998 | Schaefer | 365/233.5 |

OTHER PUBLICATIONS

MoSys Preliminary Information sheet, MoSys Home Page, url/www.mosys.com, Apr. 1, 1997.
"The MoSys Multibank™ Architecture" (MoSys Incorporated Technology Whitepaper, Jul. 1994, p. 7.

*Primary Examiner*—Tuan V. Thai
*Assistant Examiner*—Nasser Moazzami
*Attorney, Agent, or Firm*—Pennie & Edmonds LLP

[57] ABSTRACT

A multibank DRAM memory is described having individual row address strobe bar (RASB) and column address strobe bar (CASB) signals. Logically, only one row can be activated in each memory bank at a time and column access can be performed on one memory bank at a time. A token state machine is used to coordinate column access. In a first embodiment, two banks are utilized having respective asynchronous RASB signals transmitted from an external source. In a second embodiment, N DRAM memory banks are utilized having respective asynchronous internal RASB (IRASB) and internal CASB (ICASB) signals. A global RASB signal and a RASB identifier signal (RID) is used to generate the N IRASB and ICASB signals. The RID signal identifies a particular IRASB signal that is to be generated. The token state machine is operated in a round robin manner. In a third embodiment, the N DRAM memory banks are operated in a synchronous manner. The operation of the DRAM memory in this manner overlaps the precharge period associated with accessing one bank with the concurrent access of another bank.

21 Claims, 8 Drawing Sheets

MULTIPLE ROW ADDRESS STROBE DRAM ARCHITECTURE TO IMPROVE BANDWIDTH

The present invention relates generally to a memory system and, particularly, to dynamic random access memories in which the precharge overhead is minimized.

BACKGROUND OF THE INVENTION

In memory systems, including those utilizing dynamic random access memory (DRAM) arrays, a precharge overhead is incurred before a target wordline is accessed. During the precharge period, each wordline in the DRAM array is preconditioned in order to insure that only the target wordline is accessed. However, the precharge period increases the access latency which in turn reduces the bandwidth associated with accessing data from the DRAM. This problem is addressed in further detail below with reference to FIGS. 1 and 2.

FIG. 1 illustrates a typical asynchronous DRAM 100 including a memory array 110, a column address buffer 112, a row address buffer 114, a refresh controller and counter 116, a column access strobe bar (CASB) clock generator 122, a row access strobe bar (RASB) clock generator 124, a data in buffer 126, a data out buffer 125, sense amplifiers and I/O gating circuits 130, a write driver 128, an I/O sense amplifier 127, a row decoder 132, and a column decoder 134. The memory 100 operates in response to external signals provided by a controlling device 136, such as a microprocessor. The memory 100 also provides connections for external power supply ($V_{cc}$) and ground (GND) signals.

The principle of operation of DRAMs, such as the memory 100, is well known and therefore is only briefly described herein. The controller 136 initiates a memory operation by supplying address signals $A_0$-$A_n$ designating the address of a memory location where the operation is to be performed. The addresses are clocked into the DRAM by two external strobe signals, row access strobe bar (RASB) and column access strobe bar (CASB).

In asynchronous DRAM operation, when the RASB signal is in a low state, the memory array 110 is in an active period. When the RASB signal is in a high state, the memory array is in a precharge period. During the active period, the address signals are transmitted to the row decoder 132 to select a row and to activate a target word line (WL). All the cells associated with the target word line are accessed.

When the CASB signal is in a low state, the address signals are transmitted to the column decoder 134 in order to select the bit lines (BL) associated with a target column. If the memory operation is a read, the bit lines are coupled to I/O sense amplifiers 127 that sense out the data stored in the corresponding cells of the row and column that are active. If the memory operation is a write, the bit lines are coupled to write drivers 128 that write in the data which is used to program the corresponding cells of the row and column that are active. During the precharge period, before the selected word line is deactivated, the memory cells are restored and then the bit lines are preset to the precharge state.

Regardless of whether the memory operation is a write or a read, the row decoder 132 decodes the address signals $A_0$-$A_n$ and activates the word line of the row that includes the memory word that is the target of the current memory operation. Prior to activating the word line, all word lines are precharged or reset to ground. Then the target word line is activated. The precharge period is used to deactivate any activated word lines before the target word line is activated thereby ensuring that only the target word line is activated. It should be noted that in this application, the term "precharge" means resetting all the word lines to ground.

FIG. 2 illustrates the precharge period that is incurred each time a word line is activated. A first memory operation is performed which reads data stored in row one, columns one through three, and a second memory operation is performed which reads data stored in row two, columns four and five. When RASB is high, each word line in the DRAM array 110 is precharged. When RASB is low, a target word line is activated for read or write access.

Before row one is activated, a first precharge period 140 is incurred in order to deactivate all the word lines in the DRAM array 110. Then row one is activated in order to read out the data residing in the cells corresponding to row one, columns one through three. Next, a second precharge period 142 is incurred in order to deactivate all the word lines, especially the word line corresponding to row one.

The precharge overhead incurred in accessing each word line reduces the bandwidth associated with accessing data from the DRAM. A prior art multibank DRAM memory from MoSys shows one approach to alleviate this precharge overhead. In the MoSys DRAM, each memory bank is of a fixed size and is connected to a common bus internal to the multibank DRAM. The address for a target bank is broadcast on the bus. Each bank "listens" to the bus for its own address and accepts the signals intended for it.

Each memory bank acts as an independent memory array having its own column and row decoder, control circuitry and bus interface. The independence of each bank allows for the precharge period for one bank to be overlapped with the access of another bank. Although this memory design is effective at reducing the overhead associated with the precharge period, it does so by requiring each memory bank to have its own control circuitry and circuitry to interface with the bus. This increases the cost and complexity of the DRAM.

SUMMARY OF THE INVENTION

In summary, the present invention pertains to a memory architecture utilizing multiple banks of DRAMs. Each memory bank has a respective RASB signal that is used to activate the rows in a particular memory bank. Only one row can be activated in each bank at a time. Column access can be performed on one bank at a time. The operation of the DRAM memory in this manner overlaps or hides the precharge period associated with accessing one bank with the concurrent access of another bank.

In a first embodiment of the present invention, the memory architecture includes two DRAM banks. Each DRAM bank is associated with an asynchronous RASB signal that is used to activate a particular row. A single CASB signal is used to access data from either of the banks. A token state machine having a single token is controlled by both RASB signals. A row in a particular bank is activated when its corresponding RASB signal is low. A RASB signal in the low state requests control of the token from the token state machine. When the requesting RASB signal obtains control of the token, the column decoder associated with the requesting RASB signal's bank is enabled. The column decoder will then latch the column address and access the data from the bank. When the RASB signal enters a high state, precharge occurs and the token is released and passed to the next requesting RASB signal. This enables access to the data of the other bank. Thus, the precharge of one bank is overlapped or hidden with the concurrent access of the second bank.

In a second embodiment, the memory architecture includes N-DRAM banks. Each DRAM bank is associated with its own asynchronous internal RASB (IRASB) signal and internal CASB (ICASB) signal. A RASB decoder is used to generate the N multiple internal IRASB signals. The RASB decoder receives a row address strobe identifier signal (RID) and a global RASB signal. The RID signal indicates which target IRASB signal to generate.

At each transition of the global RASB signal, the combination of the global RASB signal and the RID signal sets a particular IRASB signal. This IRASB signal will activate a row in the DRAM bank corresponding to the RID signal.

A set of N internal registers is used to store the state of each IRASB signal. A register associated with a particular IRASB signal will be set or reset whenever a transition of the global RASB signal occurs and a RID signal is received specifying the particular IRASB signal. When the register is set, the corresponding IRASB signal is set to a low state thereby enabling access to a particular row. When the register is reset, the corresponding IRASB signal is set to a high state thereby precharging each row in the memory bank.

The CAS round robin token state machine, having a single token, is controlled by the N IRASB signals in order to ensure that only one DRAM bank is accessing data at each instance of time. An I RASB signal in the low state requests control of the token from the CAS round robin token state machine. When the requesting IRASB signal obtains control of the token, an associated ICASB signal is set thereby enabling a corresponding column decoder which latches in the column address. When the IRASB signal enters a high state, precharge occurs thereby releasing the token and passing it to the next requesting IRASB signal. This enables access to the data in another bank. The token is acquired based on a round robin priority scheme. In operating the multiple DRAM banks in this manner, the precharge period in one bank is overlapped with concurrent access of another bank.

In a third embodiment, the memory architecture of the N-DRAM banks described above with respect to the second embodiment is operated in a synchronous manner. A clocked RASB decoder and a clocked global RASB signal is used to generate the N multiple IRASB signals. In addition, a clocked CAS round robin state machine is used to generate the N multiple ICASB signals.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
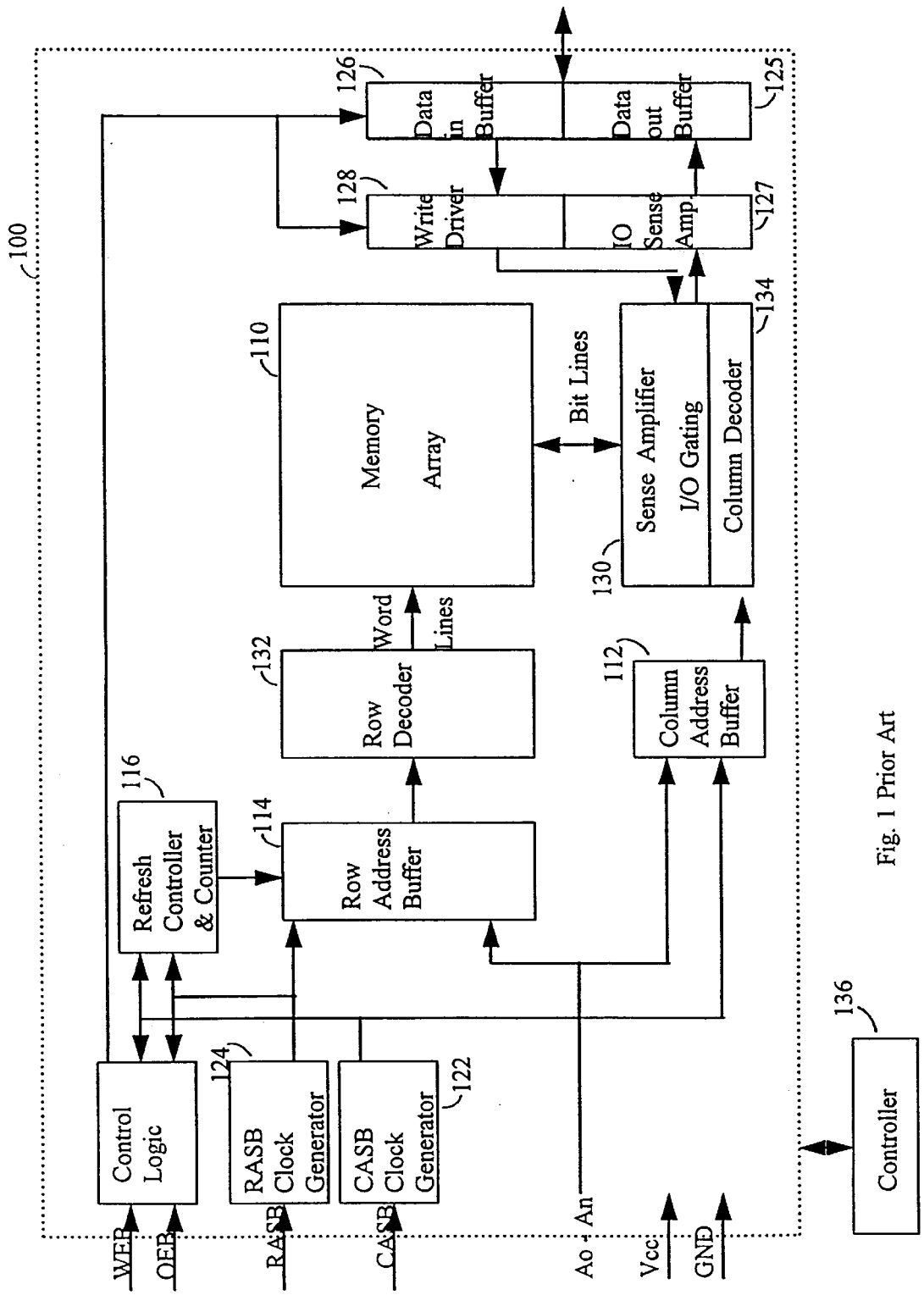
FIG. 1 is a block diagram of a prior art dynamic random access memory.
Figure 2:
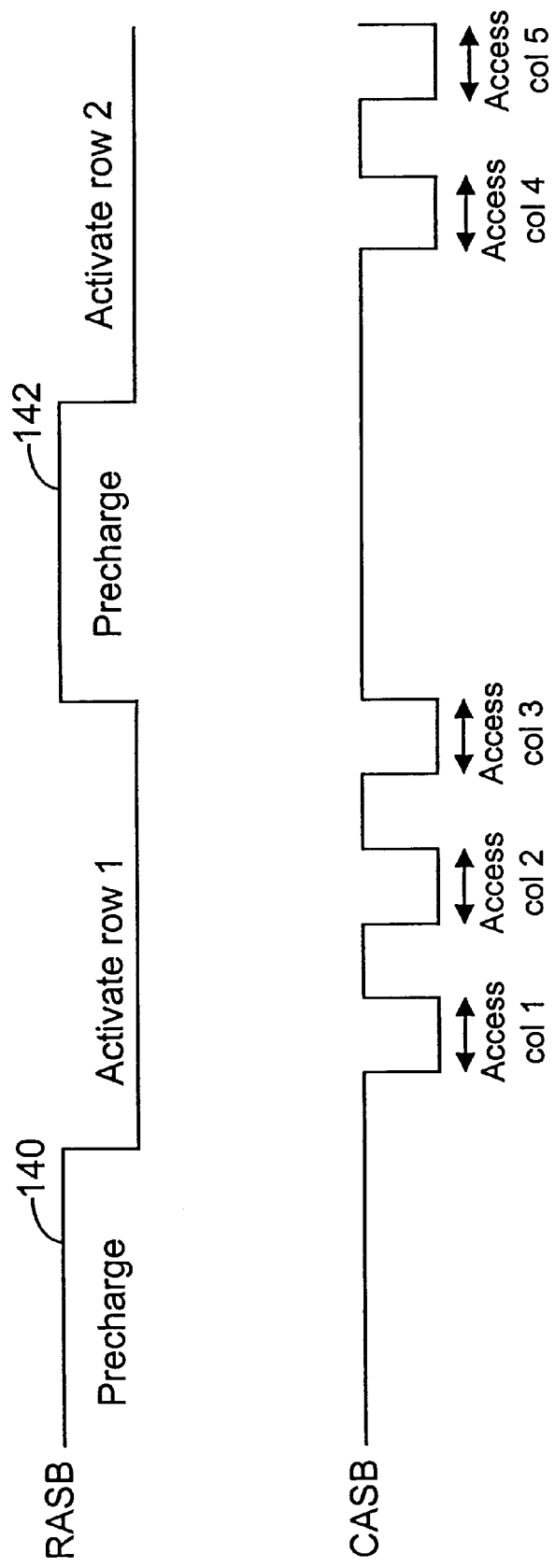
FIG. 2 is a set of timing diagrams demonstrating the operation of the memory of FIG. 1.
Figure 3:
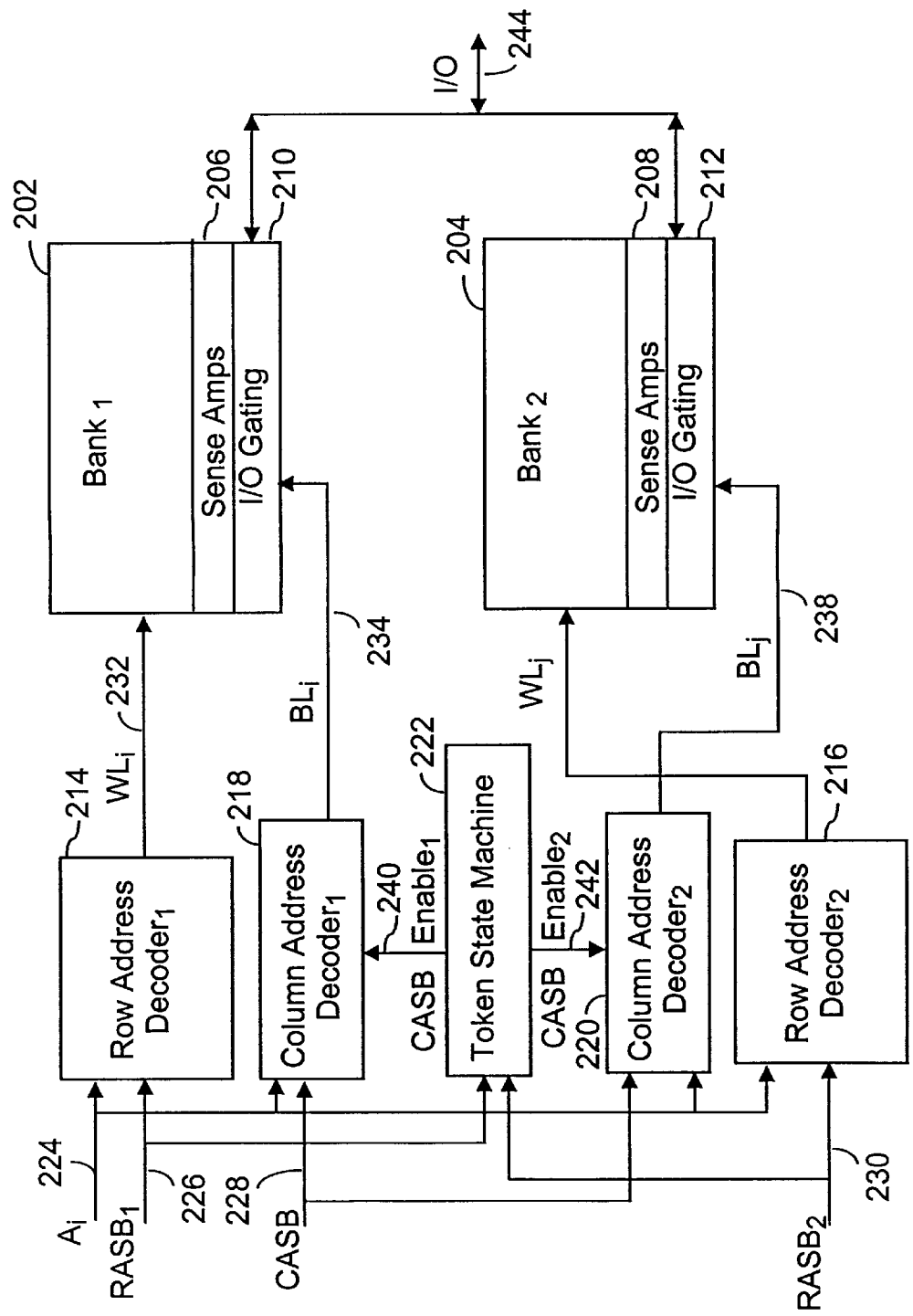
FIG. 3 is a block diagram of an asynchronous two bank DRAM memory of an embodiment of the present invention.

FIG. 3 illustrates a block diagram of a memory system 200 having a first DRAM memory bank 202 and a second DRAM memory bank 204. Each memory bank 202, 204 has its own sense amplifiers 206, 208 and I/O gating circuitry 210, 212. The size of each memory bank can vary or be of fixed size. In addition, each memory bank 202, 204 has an associated row address decoder 214, 216 and an associated column address decoder 218, 220. A token state machine 222 is used to coordinate column access to one of the memory banks 202, 204.

The first row address decoder 214 is coupled to the same address signal ($A_i$) 224 and a first RASB signal ($RASB_1$) 226 that is transmitted from an external source, such as a microprocessor (not shown). The address signal 224 includes target row and column addresses that are used in performing a memory operation. In response to these signals, which will be described below, the first row address decoder 214 activates or deactivates a target word line ($WL_i$) in the first DRAM memory bank 202.

The second row address decoder 216 is coupled to an address signal ($A_j$) 224 and a second RASB signal ($RASB_2$) 230 that is transmitted from an external source, such as a microprocessor (not shown). In response to these signals, which will be described below, the second row address decoder 216 activates or deactivates a target word line ($WL_j$) in the second DRAM memory bank 204.

The first column address decoder 218 is coupled to the address signal 224, a CASB signal 228 that is transmitted from an external source (not shown), and a first CASB enable signal 240 transmitted from the token state machine 222.

The first column address decoder 218 activates a target bit line ($BL_i$) 234 in the first memory bank 202 based on these input signals which will be described in more detail below.

The second column address decoder 220 is responsive to the address signal 224, the CASB signal 228, and a second CASB enable signal 242 transmitted from the token state machine 222. The second column address decoder 218 activates a target bit line ($BL_j$) 238 in the second memory bank 204 based on these input signals which will be described in more detail below.

The token state machine 222 is used to ensure that column access is permitted from only one of the banks at a particular point in time. The operation of state machines is well known in the art and as such will not be described herein. The function of the token state machine 222 is to coordinate enabling only one of the column address decoders at a particular point in time. In essence, the token state machine 222 can be thought of as a control mechanism. A single token held by the token state machine 222 is shared between the two DRAM memory banks 202, 204. The token state machine 222 is responsive to both RASB signals 226, 230. Based on certain conditions of these signals, which will be described in more detail below, a request is made for the token. Access to the token will be granted to one of the RASB signals by setting the corresponding CASB enable signal. This in turn will enable the respective column decoder to latch in the column address from the address signal 224 and access a respective DRAM memory bank.

In an embodiment of the present invention, the length of the address signal 224 is dependent on the number of rows, r, and columns, c, in a memory bank. It is set to $\log_2$ Max [r,c], where Max [r,c] is the largest value of either the number of rows, r, or columns, c, of a memory bank. The RASB$_1$ signal 226, the RASB$_2$ signal 230, the CASB signal 228, and the CASB enable signals 240, 242 are each 1-bit wide.

The components of the memory system 200 in FIG. 3 have now been described. Attention now turns to FIG. 4, which illustrates the operation of memory system 200.

When a RASB signal is set to a low state, the row address specified by the address signal 224 is latched and the target word line in the corresponding bank is activated. All word lines in the bank are precharged or reset when its respective RASB signal is set to a high state. Furthermore, when a RASB signal is in a low state, it is requesting the token from the token state machine 222. The token state machine 222 will grant access to the token when it is available. When the token becomes available, the respective CASB enable signal is set to a low state. This enables the appropriate column decoder which then latches in the column address included in the address signal 224. The column decoder then activates the target bit lines. The token is released when the RASB signal having access to the token is reset to a high state. At this time, the respective CASB enable signal is set to a high state.

Figure 4:
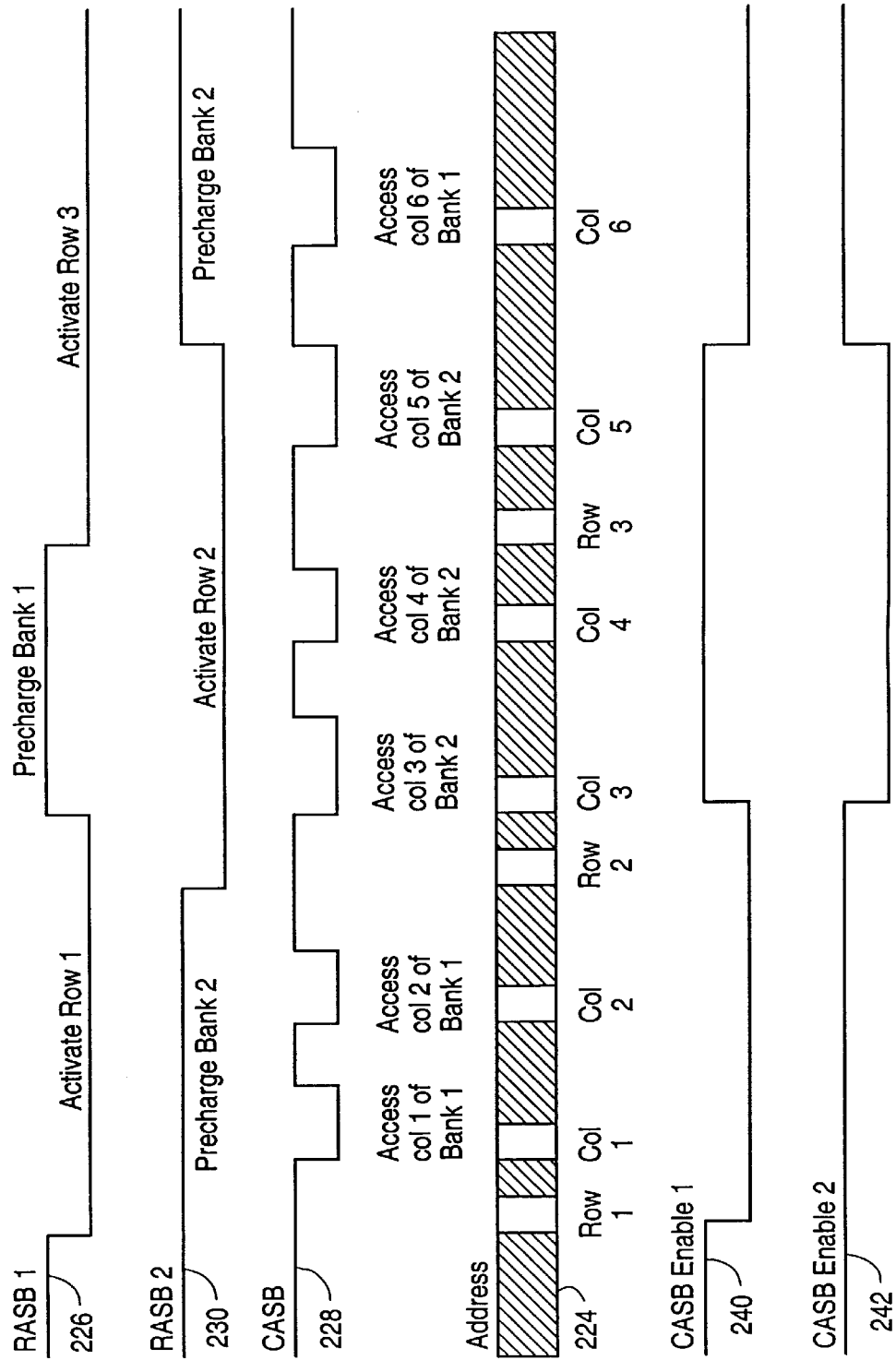
FIG. 4 is a set of timing diagrams demonstrating the operation of the memory of FIG. 3.

FIG. 4 illustrates the scenario where data is accessed from memory bank 202, row 1, columns one and two, then from memory bank 204, row two, columns 3, 4 and 5, and lastly from memory bank 202, row three, column 6.

As shown in FIG. 4, when RASB$_1$ 226 switches to a low state, the value of the address signal A$_i$ 224 is latched into the first row address decoder 214 which will activate a word line corresponding to the first row in the first DRAM bank 202. At this point RASB$_2$ 230 is in a high state or in its precharge period. The token state machine 222 receives both RASB signals and grants access to the token to RASB$_1$ 226 since the token is available and there are no other pending requests for the token. The token state machine 222 grants the request by setting the first CASB enable signal 240. This enables the first column address decoder 218. If the CASB signal is in a low state, the column decoder 218 will latch in the column address specified in the address signal 224 and activate the requisite bit lines. This enables access to the data in the first row and first column of the first memory bank 202.

At a subsequent time, the CASB signal 228 will reset to a high state. When the CASB signal 228 is set to a subsequent low state and the column decoder 218 is already enabled, another column address from the address signal 224 is latched into the column decoder 218 and the respective target bit lines activated. This enables access to the data in the first row and second column of the first memory bank 202.

It should be noted that the column address specified in the address signal 224 is used by each column decoder to determine a range of column addresses that are activated selectively. This applies to each of the embodiments of the present invention.

When RASB$_2$ 230 goes into a low state, the row address specified in address signal A$_i$ 224 is latched into the second row address decoder 220 which will activate a word line corresponding to row two in the second DRAM bank 204. At this point RASB$_1$ 226 is in a low state. The token state machine 222 waits until RASB$_1$ 226 is reset to a high state before setting the second CASB enable signal 242. When this occurs, the first memory bank 202 is precharging while data is being accessed from the second memory bank 204. Data is accessed from row two, columns three, four and five, in the second memory bank 204 as described above.

Subsequently, RASB$_1$ 226 is set to a low state while RASB$_2$ 230 is low and data is accessed from the second memory bank 204. When RASB$_2$ 230 is reset to a high state, the shared token is released thereby disabling the second CASB enable signal 242 and enabling the first CASB enable signal 240. Once the first CASB enable signal 240 is set, data can be accessed from the third row and sixth column of the first memory bank 202 in a similar fashion as was described above.

The operation of the first preferred embodiment of the present invention has been described. Attention now turns to a memory system of the second embodiment which includes N asynchronous DRAM memory banks.

Figure 5:
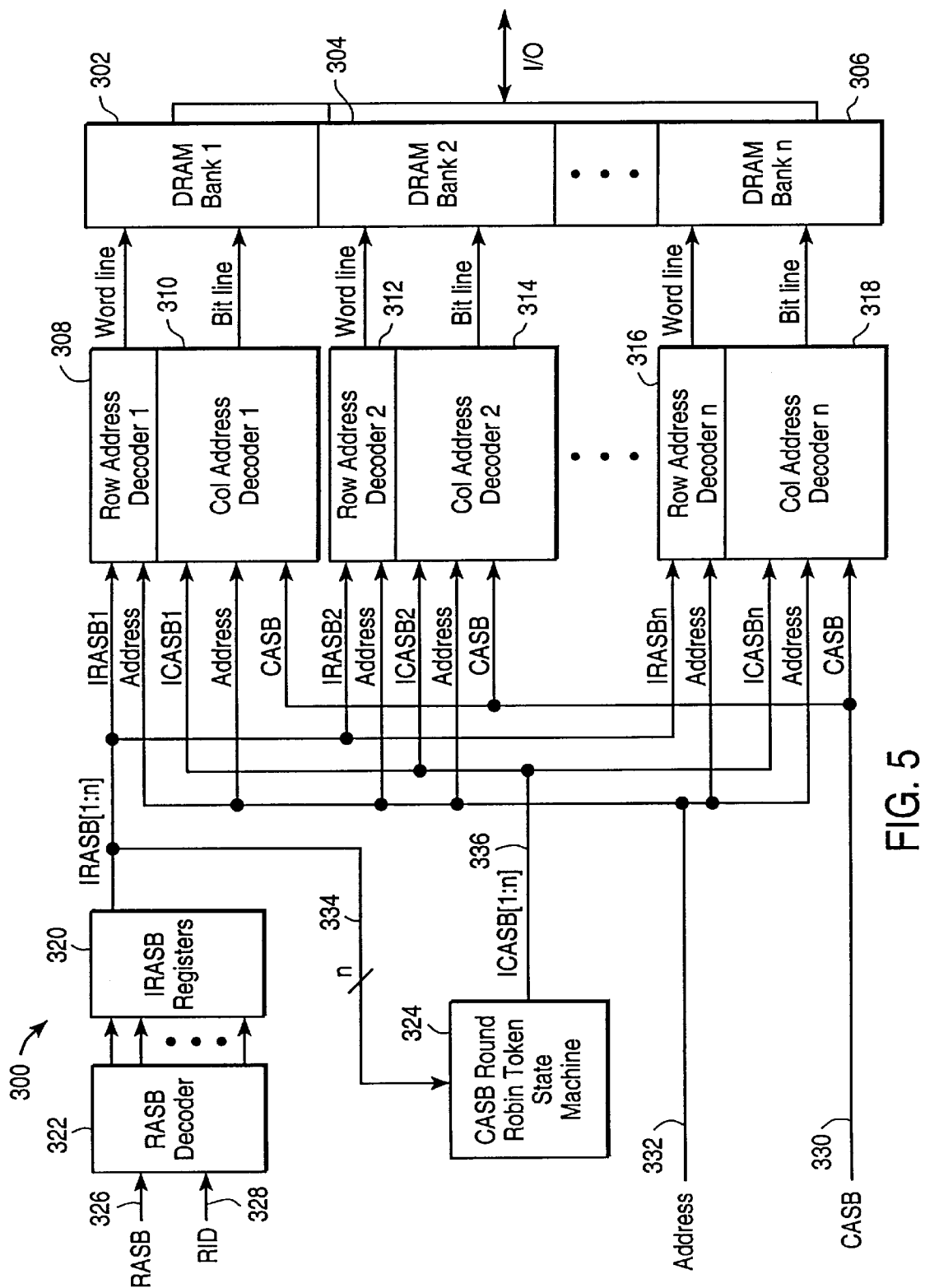
FIG. 5 is a block diagram of an asynchronous N-bank DRAM memory of an embodiment of the present invention.

FIG. 5 illustrates a block diagram of a memory system 300 having N DRAM memory banks 302, 304, 306. Each memory bank 302, 304, 306 has its own sense amplifiers and I/O gating circuitry (not shown). The number of rows and columns in each memory bank can vary or be of a fixed dimension. In addition, each memory bank 302, 304, 306 has its own associated row address decoder 308, 312, 316 and an associated column address decoder 310, 314, 318. A CASB round robin token state machine 324 is used to coordinate column access to one of the memory banks 302, 304, 306. Further, there is a RASB decoder 322 and a set of N IRASB registers 320.

The RASB decoder 322 is coupled to a global RASB signal 326 and a RASB identifier (RID) signal 328, both of which are transmitted from an external source (not shown). In response to these signals, the RASB decoder 322 will generate at most N internal RASB (IRASB) signals 334, where N is the number of memory banks in the memory system 300. Each IRASB signal 334 is associated with a particular row address decoder and is used to indicate a target word line to activate. The RID signal 328 specifies a particular IRASB signal that the RASB decoder 322 is to generate.

The RASB decoder 322 is coupled to a set of N IRASB registers 320, where N is the number of memory banks in the memory system 300. There is an IRASB register 320 for each IRASB signal 334. The function of the IRASB register 320 is to store the state of each IRASB signal 334 that is generated from the RASB decoder 322. The current state of an IRASB signal 334 is used to determine whether to set or reset a particular IRASB signal 334 when certain conditions occur, which will be described in more detail below.

Each DRAM memory bank has an associated row address decoder. Each row address decoder 308, 312, 316 is coupled to an externally-generated address signal 332 and a particular IRASB signal 334. Under certain conditions of these signals that are described below, the row decoder will latch in a row address specified in the address signal 332 and activate a corresponding word line in the associated DRAM memory bank. Under other conditions of these signals that are described below, the row decoder will precharge each word line in its associated DRAM memory bank.

A CASB round robin token state machine 324 is provided which is coupled to an externally generated CASB signal 330 and the N IRASB signals 334. The CASB round robin token state machine 324 is used to ensure that column access is permitted from only one of the banks at a particular point in time. This is accomplished by the CASB round robin token state machine 324 generating one of N internal CASB (ICASB) signals at a particular point in time, where N is the number of memory banks in the memory system 300. Each ICASB signal 336 is associated with a particular column address decoder.

The operation of state machines is well known in the art and as such will not be described herein. The function of the CASB round robin token state machine 324 is to coordinate enabling only one of the column address decoders at a particular instance of time. A single token held by the token state machine 324 is shared between each of the IRASB signals 334. The token state machine 324 is responsive to each IRASB signal 334. Based on certain conditions of these signals that will be described in more detail below, a request is made for the token. Access to the token will be granted to one of the IRASB signals 334 by setting a corresponding ICASB signal 336. This ICASB signal 336 will then enable a column decoder associated with a target DRAM memory bank.

The CASB round robin token state machine 324 uses a round robin scheme in granting the token. In a preferred embodiment, each DRAM memory bank will be associated with a particular order and granted access to the token based on this order in a round robin manner.

The combination of the CASB round robin token state machine 324, the RASB decoder 322, and IRASB registers 320 can be thought of as a control mechanism since it generates the N IRASB and N ICASB signals that enable access to the N DRAM memory banks.

Each DRAM memory bank is associated with its own column address decoder. Each column address decoder is coupled to the address signal 332, CASB signal 330 and its respective ICASB signal 336. Each column address decoder is enabled whenever its corresponding ICASB signal 336 is set thereby allowing a respective column address decoder to latch in a column address from the address signal 332 and to activate the target bit lines in its associated DRAM memory bank.

In an embodiment of the present invention, the length of the address signal 224 is dependent on the number of rows, r, and columns, c, in a memory bank. It is set to $\log_2$ Max [r, c], where Max [r, c] is the largest value of either the number of rows, r, or columns, c, of a memory bank. The global RASB signal 326 and the CASB signal 330 are each one bit wide. The length of each of the N IRASB signals 334 and each of the N ICASB signals 336 is set to N, which is the number of memory banks. The length of the RID signal 328 is set to $\log_2$ N, where N is the number of memory banks.

The components of the memory system 300 in FIG. 5 have now been described. Attention now turns to FIG. 6, which illustrates the operation of the memory system 300 described in FIG. 5.

At each transition of the global RASB signal 326, the combination of the global RASB signal 326 and the RID signal 328 sets or resets the IRASB signal 334 specified by the RID signal 328. A particular IRASB signal 334 is set to a low state when the current state of the IRASB signal 334 is in a high state and is reset to a high state when the current state of the IRASB signal 334 is in a low state. Each IRASB register 320 tracks the current state of an associated IRASB signal 334 in order to make this assessment.

When an IRASB signal 334 is set to a low state, the row address specified by the address signal 332 is latched and the target word line is activated. All word lines in the bank are precharged or reset when its respective IRASB signal 334 is set to a high state. Furthermore, when an IRASB signal 334 is in a low state, it is requesting a token from the CASB round robin token state machine 324. The CASB round robin token state machine 324 will grant access to the token when it is available and is the "round robin" turn of the respective IRASB signal 334.

When a requesting IRASB signal 334 is granted the token, the respective ICASB signal 336 is set to a low state. This enables the associated column address decoder to latch in the column address specified in the address signal 332 and to activate the target bit lines in the associated DRAM memory bank.

When the IRASB signal 334 having the token is reset, the token is released and passed to another requesting IRASB signal 334 in accordance with the round robin order. The associated ICASB signal 336 is also reset. This will enable a pending requesting IRASB signal 334 to access cells in its associated DRAM memory bank.

Figure 6:
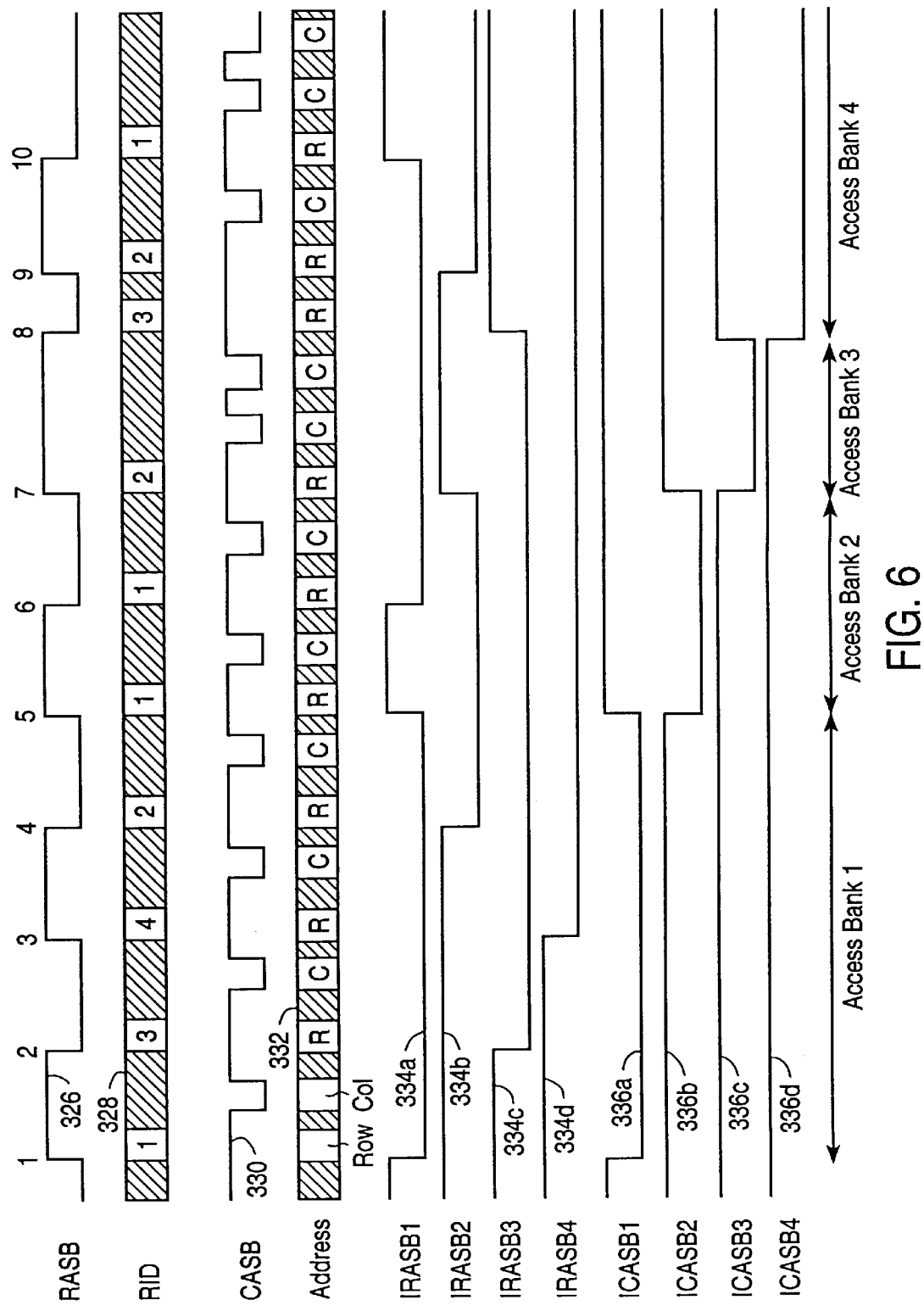
FIG. 6 is a set of timing diagrams demonstrating the operation of the memory of FIG. 5.

FIG. 6 illustrates an exemplary operation of the second embodiment of the present invention. In this diagram, there are four DRAM memory banks. It should be noted that the second embodiment is applicable to any number of DRAM memory banks and that FIG. 6 illustrates the scenario of four DRAM memory banks for illustration purposes only. As such, the first DRAM memory bank is accessed first, followed by an access to the second DRAM memory bank, then an access to the third DRAM memory bank, and lastly the fourth DRAM memory bank is accessed. For the purposes of this illustration, the round robin ordering scheme is as follows: DRAM memory bank one, DRAM memory bank two, DRAM memory bank three, and DRAM memory bank four.

At the first transition of the global RASB signal 326, the RASB decoder 322 samples the RID signal 328. At this transition, the RASB decoder 322 determines that the RID signal 328 identifies $IRASB_1$. The RASB decoder 322 then reads the value of the current state of the $IRASB_1$ signal that is stored in the $IRASB_1$ register 320. The current state of the $IRASB_1$ signal is high, so the RASB decoder 322 switches its state to low and stores this current state in $IRASB_1$'s associated register 320. The $IRASB_1$ signal is transmitted to its associated row address decoder 308 which then latches in the row address specified in the address signal 332 and activates the respective word line.

The CASB round robin token state machine 324 receives each of the N IRASB signals 334. Since all other IRASB signals are in the high state and $IRASB_1$ has the first turn for the token, the CASB round robin token state 324 machine grants access to the token to $IRASB_1$ by setting its associated ICASB signal 336 to a low state. This enables the respective column address decoder 310 to latch in the column address specified on the address signal 332 and to activate the target bit lines in the associated DRAM memory bank 302. The data in the activated row and column cells are then accessed.

At the second transition of the global RASB signal 326, the RASB decoder 322 latches in the value of the RID signal 328 which in this case is for $IRASB_3$. The RASB decoder 322 then reads the value of the current state of the $IRASB_3$ signal that is stored in the $IRASB_3$ register 320. The current state of the $IRASB_3$ signal is high, so the RASB decoder 322 switches its state to low and stores the current state in $IRASB_3$'s associated register 320. The $IRASB_1$ signal is transmitted to its associated row address decoder 308 which then latches in the row address specified in the address signal 332 and activates the respective word line.

The CASB round robin token state machine 324 receives each of the N IRASB signals 334. Since the $IRASB_1$ signal has possession of the token, the CASB round robin token state machine 324 ignores the request until it is IRASB$_3$'s turn for the token. Transitions 3, 4, 6 and 9 of the global RASB signal 326 operate in a similar fashion as described above with respect to transition 2.

At the fifth transition of the global RASB signal 326, the RASB decoder 322 latches in the value of the RID signal 328 which in this case is for IRASB$_1$. The RASB decoder 322 then reads the value of the current state of the IRASB$_1$ signal that is stored in the IRASB$_1$ register 320. The current state of the IRASB$_1$ signal is low, so the RASB decoder 322 switches its state to high and stores this current state in IRASB$_1$'s associated register 320. The IRASB$_1$ signal is transmitted to its associated row address decoder 308 which then precharges the word lines in the respective memory bank 302.

Furthermore, the CASB round robin token state machine 324 receives the IRASB signals 334. Since IRASB$_1$ is high, the token is released and passed to IRASB$_2$ since it has previously requested the token at the fourth RASB transition and is next in the round robin order to receive the token. The CASB round robin token state machine 324 sets ICASB$_2$ to a low state at transition five thereby enabling the corresponding column address decoder 314 which latches in the column address received in the address signal 332. The column address decoder 314 then activates the corresponding bit lines.

The operations of the second embodiment for transitions six through ten can be inferred from the preceding descriptions.

Attention now turns to the third embodiment of the memory system which extends the second embodiment to synchronous operation with N DRAM memory banks.

Figure 7:
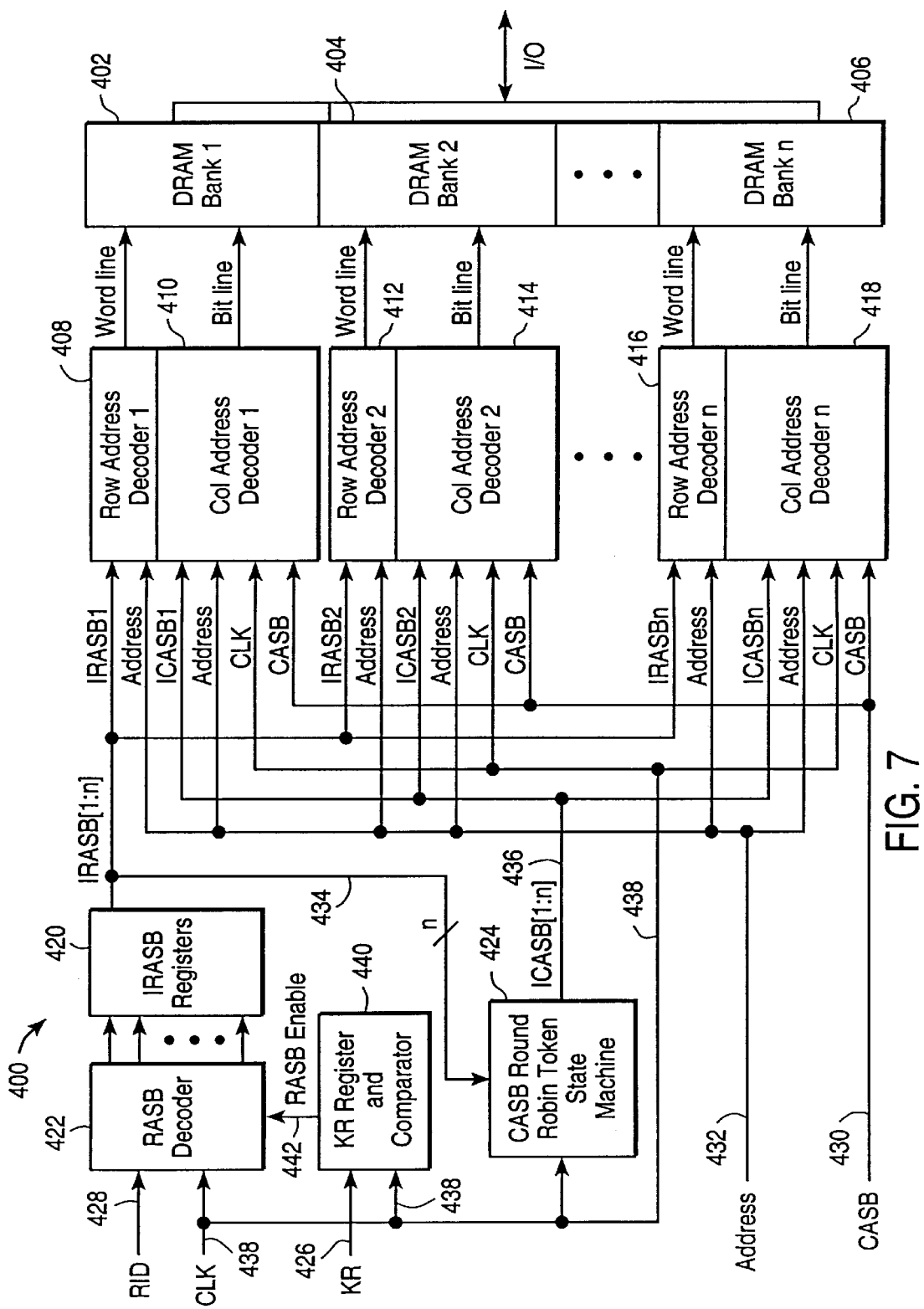
FIG. 7 is a block diagram of a synchronous N-bank DRAM memory of an embodiment of the present invention.

FIG. 7 illustrates a block diagram of a memory system 400 having N DRAM memory banks 402, 404, 406. Each memory bank 402, 404, 406 has its own sense amplifiers and I/O gating circuitry (not shown). The number of rows and columns in each memory bank can vary or be of a fixed dimension. In addition, each memory bank 402, 404, 406 has its own associated row address decoder 408, 412, 416 and an associated column address decoder 410, 414, 418. A CASB round robin token state machine 424 is used to coordinate column access to one of the memory banks 402, 404, 406. A RASB decoder 422 and a set of N IRASB registers 420 is used to generate N synchronous IRASB signals 434. A clocked RASB (KR) register and comparator 440 is used to track when the clocked RASB (KR) signal 426 changes state.

The KR register and comparator 440 is responsive to a clock signal 438 and a KR signal 426, both of which are transmitted from an external source (not shown). The KR register and comparator 440 stores the current state of he KR signal 426 and at each transition of the clock signal 438 determines whether or not the state of the KR signal 426 has changed. When there is a change in the state of the KR signal 426 at a clock transition, the KR register and comparator 440 sets a RASB enable signal 442 which is transmitted to the RASB decoder 422.

The RASB decoder 422 is coupled to a RASB identifier (RID) signal 428 and a clock signal 438, both of which are transmitted from an external source (not shown). In addition, the RASB decoder 422 is coupled to the RASB enable signal 442, which is transmitted from the KR register and comparator 440. In response to these signals, the RASB decoder 422 will generate one of the N internal RASB (IRASB) signals 434, where N is the number of memory banks in the memory system 400. Each IRASB signal 434 is associated with a particular row address decoder and is used to indicate a target word line to activate. The RID signal 428 specifies a particular IRASB signal that the RASB decoder 422 is to generate.

The RASB decoder 422 is coupled to a set of N IRASB registers 420, where N is the number of memory banks in the memory system 400. There is an IRASB register 420 for each IRASB signal 434. The function of the IRASB register 420 is to store the state of each IRASB signal 434 that is generated from the RASB decoder 422. The current state of an IRASB signal 434 is partially used to determine whether to set or reset a particular IRASB signal 434 when certain conditions occur. This will be described in more detail below.

Each DRAM memory bank has an associated row address decoder. Each row address decoder 408, 412, 416 is coupled to an eternally-generated address signal 432 and to a particular IRASB signal 434. Under certain conditions of these signals that are described below, the row decoder will latch in a row address specified in the address signal 432 and activate a corresponding word line in the associated DRAM memory bank. Under other conditions of these signals that are described below, the row decoder will precharge each word line in its associated DRAM memory bank.

A CASB round robin token state machine 424 is provided which is coupled to the N IRASB signals 434 and the clock signal 438. The CASB round robin token state machine 424 is used to ensure that column access is permitted from only one of the banks at a particular point in time. This is accomplished by the CASB round robin token state machine 424 generating one of N internal CASB (ICASB) signals 436 at a particular point in time, where N is the number of memory banks in the memory system 400. Each ICASB signal 436 is associated with a particular column address decoder.

The operation of state machines is well known in the art and as such will not be described herein. The function of the CASB round robin token state machine 424 is to coordinate enabling only one of the column address decoders at a particular instance of time. A single token held by the token state machine 424 is shared between each of the IRASB signals 434. The token state machine 424 is responsive to each IRASB signal 434 and the clock signal 438. Based on certain conditions of these signals which will be described in more detail below, a request is made for the token. Access to the token will be granted to one of the IRASB signals 434 by setting a corresponding ICASB signal 436. This ICASB signal 436 will then enable a column decoder associated with a target DRAM memory bank.

The CASB round robin token state machine 424 uses a round robin scheme in granting the token. In a preferred embodiment, each DRAM memory bank will be associated with a particular order and granted access to the token based on this order in a round robin manner.

The combination of the CASB round robin token state machine 424, the RASB decoder 422, the IRASB registers 420, and the KR register and comparator 440 can be thought of as a control mechanism since it generates the N IRASB and N ICASB signals that enable access to the N DRAM memory banks.

Each DRAM memory bank is associated with its own column address decoder. Each column address decoder is coupled to the address signal 432, the CASB signal 430 and its respective ICASB signal 436. Each column address decoder is enabled whenever its corresponding ICASB signal 436 is set thereby allowing a respective column address decoder to latch in a column address from the address signal 432 and to activate the target bit lines in its associated DRAM memory bank.

In an embodiment of the present invention, the length of the address signal 224 is dependent on the number of rows, r, and columns, c, in a memory bank. It is set to $\log_2$ Max [r, c], where Max [r, c] is the largest value of either the number of rows, r, or columns, c, of a memory bank. The clocked RASB signal 426, the clock signal 438, and the CASB signal 430 are each one bit wide. The length of each of the N IRASB signals 434 and each of the N ICASB signals 436 is set to N, which is the number of memory banks. The length of the RID signal 428 is set to $109_2$ N, where N is the number of memory banks.

The components of the memory system 400 in FIG. 7 have now been described. Attention now turns to the FIG. 8 which illustrates the operation of the memory system 400 described in FIG. 7.

At each transition of the global clock signal 438, the KR register and comparator 440 samples the current state of the KR signal 426 and compares it with a previous state. If the previous state of the KR signal 426 differs from its current state, the KR register and comparator 440 sets a RASB enable signal 442 that is transmitted to the RASB decoder 422. In addition, the current state of the KR signal 426 is stored in the KR register 440. If the previous state of the KR signal 426 is the same as its current state, the KR register and comparator 440 is not set thereby disabling the RASB decoder 422.

The RASB decoder 422, once enabled, samples the RID signal 428 and sets or resets the IRASB signal 434 specified by the RID signal 428. A particular IRASB signal 434 is set to a low state when the current state of the IRASB signal 434 is in a high state and reset to a high state when the current state of the IRASB signal 434 is in a low state. Each IRASB register 420 tracks the current state of an associated IRASB signal 434 in order to make this assessment.

When an IRASB signal 434 is set to a low state, the row address specified by the address signal 432 is latched and the target word line is activated. All word lines in the bank are precharged or reset when its respective IRASB signal 434 is set to a high state. Furthermore, when an IRASB signal 434 is in a low state, it is requesting a token from the CASB round robin token state machine 424. The CASB round robin token state machine 424 will grant access to the token when it is available and it is the "round robin" turn of the respective IRASB signal 434.

When a requesting IRASB signal 434 is granted the token, the respective ICASB signal 436 is set to a low state. This enables the associated column address decoder to latch in the column address specified in the address signal 432 and to activate the target bit lines in the associated DRAM memory bank. The column address decoder will latch in the column address when the CASB signal 430 is set to a low state, at a transition of the global clock signal 438.

When the IRASB signal 434 having the token is reset, the token is released and passed to another requesting IRASB signal 434 in accordance with the round robin order. The associated ICASB signal 436 is also reset This will enable a pending requesting IRASB signal 434 to access cells in its associated DRAM memory bank.

Figure 8:
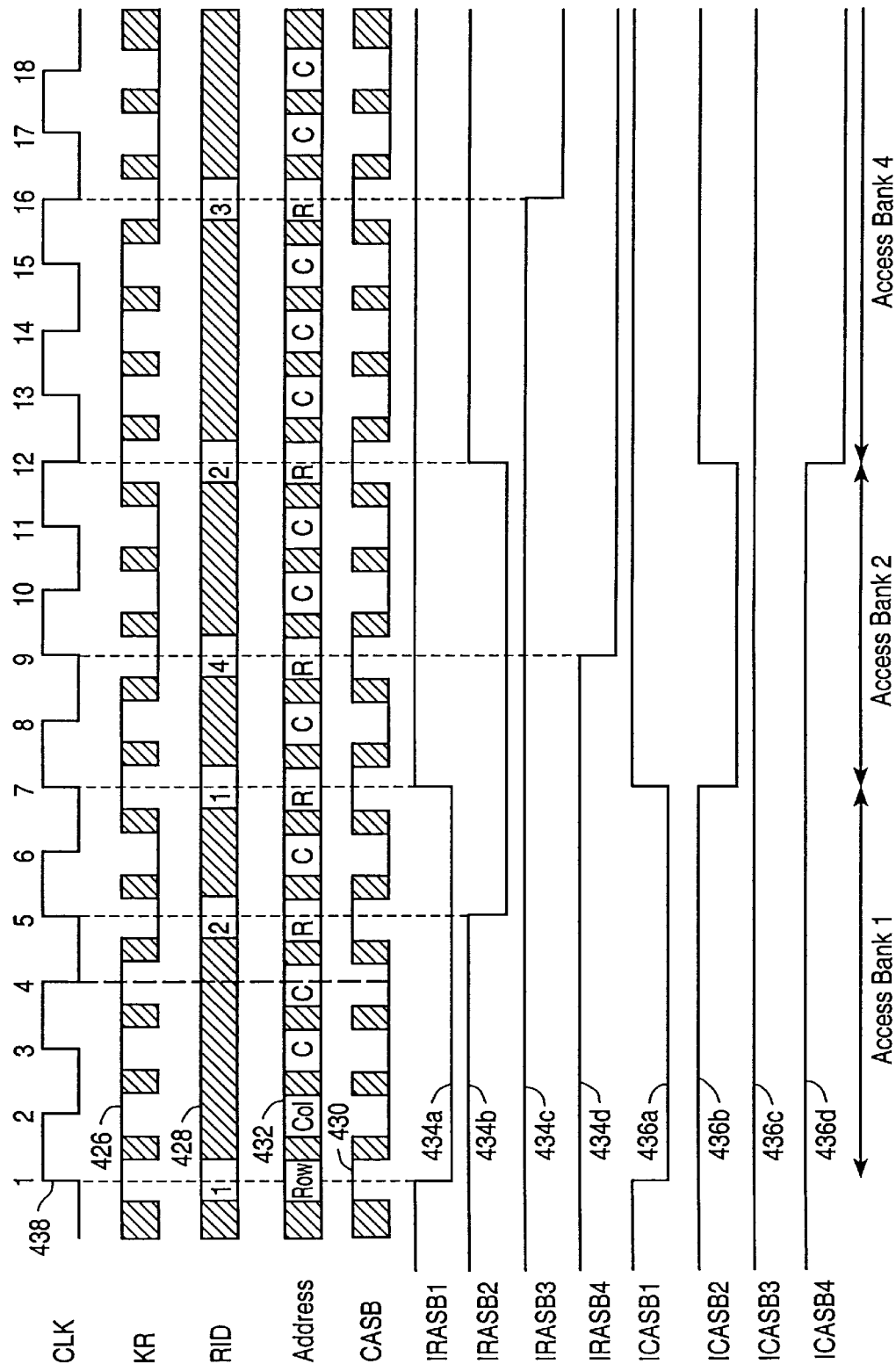
FIG. 8 is a set of timing diagrams demonstrating the operation of the memory of FIG. 7.

FIG. 8 illustrates an exemplary operation of the third embodiment of the present invention. In this diagram, there are four DRAM memory banks. It should be noted that the third embodiment is applicable to any number of DRAM memory banks and that FIG. 8 illustrates the scenario of four DRAM memory banks for illustration purposes only. As such, the first DRAM memory bank is accessed first, followed by an access to the second DRAM memory bank, and then an access to the fourth DRAM memory bank. For the purposes of this illustration, the round robin ordering scheme is as follows: DRAM memory bank one, DRAM memory bank two, DRAM memory bank three, and DRAM memory bank four.

At the first transition of the global clock signal 438, the KR register and comparator 440 samples the KR signal 426 and compares it with the immediately preceding state of the KR signal 426. In this example, the sampled state differs from the stored state, so the sampled state is stored and the RASB enable signal 442 is set. The RASB decoder 422 samples the RID signal 428 and determines that the RID signal 428 identifies IRASIB. The RASB decoder 422 checks the current state of the $IRASB_1$ signal. The current state of the $IRASB_1$ signal is high, so the RASB decoder 422 switches its state to low and stores this current state in $IRASB_1$'s associated register 420. The $IRASB_1$ signal is transmitted to its associated row address decoder 408 which then latches in the row address specified in the address signal 432 and activates the respective word line.

At each clock transition, the CASB round robin token state machine 424 receives each of the N IRASB signals 434. Since all other IRASB signals are in the high state and $IRASB_1$ has the first turn for the token, the CASB round robin token state machine 424 grants access to the token to $IRASB_1$ by setting its associated ICASB signal to a low state. This enables the respective column address decoder 410 to latch in the column address specified on the address signal 432 when the CASB signal 430 is set to a low state at a transition of a global clock signal 438. The column address decoder 410 activates the target bit lines so that the data in the activated row and column cells can be accessed.

At the second, third and fourth transitions of the global clock signal 438, the state of the KR signal has not changed and no further action is taken. At the fifth transition of the global clock signal 438, the KR register and comparator 440 determines that the state of the KR signal 426 has changed and the RASB enable signal 442 is set. The RASB decoder 422 samples the RID signal 428 which indicates the $IRASB_2$ signal. The $IRASB_2$ signal is set to a low state thereby enabling the associated row address decoder 412 to latch in the row address present in the address signal 432 and to activate the second row in the second memory bank 404. Transitions nine and sixteen operate in a similar manner.

At the sixth transition of the global clock signal 438, the state of the KR signal 426 has not changed and no further action is taken. At the seventh transition of the global clock signal 438, a transition occurs in the state of the KR signal 426 thereby enabling the RASB decoder 422. The RASB decoder 422, in turn, will reset the $IRASB_1$ signal to a high state which will precharge the first memory bank 402. The CASB round robin token state machine 424 will receive each of the N IRASB signals and reset the $ICASB_1$ signal thereby releasing the token. The token will be passed to the $ICASB_2$ signal since it is next in the "round robin" turn for the token. The $ICASB_2$ signal is set to a low state thereby enabling the second column address decoder 414 to latch in the column address in the address signal 432 and activating the corresponding bit lines. The data in the cells of the activated row and column are then accessed. The twelfth transition operates in a like manner to access data from the fourth memory bank.

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

The preferred embodiments of the present invention have been described using a state machine. However, the present invention is not limited to a state machine and other types of electronic components providing similar functionality can be used. In addition, the present invention is not limited to a token state machine operating in a round robin scheme. Other types of operational schemes can be used that provide similar functionality. Further, the present invention has been described with respect to preferred signal bit lengths. Again, the present invention is not constrained to these particular bit lengths as others can be used that perform similar functionality.

What is claimed is:

1. A memory system, comprising:
    a plurality of N dynamic random access memory (DRAM) banks;
    a plurality of N internal row address strobe bar (IRASB) signals, each of said IRASB signal being associated with a corresponding one of said N DRAM banks;
    a plurality of N internal column address strobe bar (ICASB) signals, each said ICASB signal associated with a corresponding one of said N DRAM banks; and
    a control mechanism for activating one or more of said N IRASB signals and a select one of said N ICASB signals, said control mechanism responsive to a row address stobe bar (RASB) identifier (RID) signal specifying a select one of said N IRASB signals;
    wherein
    said control mechanism activates one of said IRASB signals for each received value of said RID signal;
    when a single one of said IRASB signals is activated, said control mechanism activates a corresponding one of said ICASB signals;
    when more than one of said IRASB signals are activated, said control mechanism activates a select one of said ICASB signals based on said activated IRASB signals and in accordance with a predefined priority scheme;
    said IRASB and ICASB signals are used to access data in said memory system.

2. The memory system of claim 1,
    said control mechanism comprising:
        a state machine that receives each of said IRASB signals and activates said select one of said ICASB signals based on said predefined priority scheme.

3. The memory system of claim 2,
    said control mechanism comprising:
    a decoding mechanism for receiving a global RASB signal and said RID signal and activating a respective IRASB signal based on said RID signal; and
    a storage mechanism for storing a current state of each of said N IRASB signals;
    wherein said control mechanism sets or resets a particular IRASB signal on a transition of said global RASB signal when said RID signal specifies said particular IRASB signal and said particular IRASB signal's current state is at a prescribed state.

4. The memory of claim 3,
    wherein said control mechanism sets a particular IRASB signal on a transition of said global RASB signal when said RID signal specifies said particular IRASB signal and said particular IRASB signal's current state is at a reset state; and
    wherein said control mechanism resets a particular IRASB signal on a transition of said global RASB signal when said RID signal specifies said particular IRASB signal and said particular IRASB signal's current state is a set state.

5. The memory system of claim 1,
    wherein said N IRASB signals and said N ICASB signals are activated in an asynchronous manner.

6. The memory system of claim 1,
    wherein said N IRASB signals and said N ICASB signals are activated in a synchronous manner.

7. The memory system of claim 1,
    wherein said predefined priority scheme comprises a round robin priority scheme.

8. A memory system comprising:
    a first and second dynamic random access memory DRAM bank, said first DRAM memory bank associated with a first row address strobe bar RASB signal and a first column address strobe bar CASB signal and said second DRAM memory bank associated with a second row address strobe bar RASB signal and a second column address strobe bar CASB signal; and
    a control mechanism responsive to said first and second RASB signals; wherein
    when a single one of said first and second RASB signals is activated, said control mechanism activates one of said first and second CASB signals;
    when first and second RASB signals are activated, said control mechanism controls activation of said CASP signals based on said activated IRASB signals and in accordance with a predefined priority scheme.

9. The memory system of claim 8,
    wherein each said RASB signal requests access to a respective DRAM memory bank when each said RASB signal is set to a set state;
    wherein said control mechanism enables access to a respective DRAM memory bank when no data is currently accessed from the other DRAM memory bank; and
    wherein each said RASB signal releases access to a respective DRAM memory bank when each said RASB signal is set to a reset state.

10. The memory system of claim 8,
    a first and second column address decoders, said first column address decoder associated with said first DRAM memory bank and said second column address decoder associated with said second DRAM memory bank, said first column address decoder enabled by a first CASB enable signal and said second column address decoder enabled by a second CASB enable signal;
    said control mechanism including a token state machine, said token state machine generating said first CASB enable signal when said first RASB signal is in a set state and has acquired a token, said token state machine generating said second CASB enable signal when said second RASB signal is in a set state and has acquired said token;
    wherein said token is released when said RASB signals are set to a reset state.

11. The memory system of claim 10,
    wherein said first and second RASB signals and said CASB enable signals are generated in an asynchronous manner.

12. A memory system, comprising:
a plurality of N dynamic random access memory (DRAM) banks;
a plurality of N internal row address strobe (IRASB) signals, each of said IRASB signal being associated with a select one of said N DRAM banks;
a plurality of N internal column address strobe (ICASB) signals, each said ICASB signal associated with a select one of said N DRAM banks;
a control mechanism for activating one or more of said N IRASB signals and a select one of said N ICASB signals, said control mechanism responsive to a RASB identifier (RID) signal, a clock signal, and a clocked global RASB signal, said RID signal representing a specified IRASB signal, said control mechanism comprising:
a decoding mechanism for activating the one or more of said IRASB signals and for storing a current state of each of said IRASB signals;
a storage mechanism for storing a current state of said global RASB signal;
a comparator for determining a change in state of said global RASB signal; and
a state machine for activating said select ICASB signal;
wherein
said control mechanism at each transition of said clock signal for which said clocked global RASB signal is at a state that differs from the stored current state of said clocked global RASB signal, sets a particular IRASB signal to a state that differs from a current state of the particular IRASB signal;
when a single one of said N IRASB signals is activated, said control mechanism activates a corresponding one of said N ICASB signals;
when more than one of said N IRASB signals are activated, said control mechanism activates one of said N ICASB signals based on said activated IRASB signals and in accordance with a predefined priority scheme.

13. The memory system of claim 12,
wherein said state machine is a token state machine granting access to a particular DRAM memory bank once a requisite token is obtained in accordance with said predefined priority scheme.

14. The memory system of claim 13,
wherein said said predefined priority scheme comprises a round robin priority scheme.

15. A method for accessing data in a memory system, said method comprising the steps of:

(a) providing N DRAM memory banks, each said DRAM memory bank having an associated internal row address strobe bar (IRASB) signal and an associated internal column address strobe bar (ICASB) signal, each said IRASB signal having a set state and a reset state;

(b) receiving a RASB identifier (RID) signal identifying a select one of said IRASB signals and a global RASB signal;

(c) upon each transition of said global RASB signal, setting a particular IRASB signal identified by said RID signal to a state that differs from a current state of said particular IRASB signal;

(d) upon each IRASB signal being set to a set state, requesting a token that is shared amongst said N IRASB signals;

(e) granting a select IRASB signal access to said token based on said IRASB signals requesting a token and in accordance with a predefined priority scheme and activating the ICASB signal corresponding to said select IRASB signal having been granted access to said token; and (f) accessing data from a DRAM memory bank associated with said select IRASB signal having acquired access to said token.

16. The method of claim 15, prior to step (c), storing a previous state of each of said N IRASB signals.

17. The method of claim 15,
prior to step (c), associating a round robin order with each of said N IRASB signals;
said step (e) further comprising the step of:
granting access to a requesting IRASB signal in accordance with said round robin priority order.

18. The method of claim 15,
upon each IRASB signal being set to a reset state, releasing said token.

19. The method of claim 15,
wherein said N IRASB signals and said N ICASB signals are activated in an asynchronous manner.

20. The method of claim 15,
wherein said N IRASB signals and said N ICASB signals are activated in a synchronous manner.

21. The method of claim 15,
wherein said activated ICASB signal enables access to data residing in a DRAM memory bank associated with said select IRASB signal.

* * * * *